(12) United States Patent
Miyagi

(10) Patent No.: US 6,566,928 B1
(45) Date of Patent: May 20, 2003

(54) LATCH CIRCUIT

(75) Inventor: Masanori Miyagi, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/638,197

(22) Filed: Aug. 11, 2000

(30) Foreign Application Priority Data

Oct. 25, 1999 (JP) ............................................ 11-302537

(51) Int. Cl.$^7$ .......................... H03K 3/037; H03L 7/00
(52) U.S. Cl. ...................................... 327/217; 327/143
(58) Field of Search ................................ 327/142, 143, 327/198, 199, 200, 217

(56) References Cited

U.S. PATENT DOCUMENTS 5,629,642 A * 5/1997 Yoshimura ................... 327/142
5,774,402 A * 6/1998 Lee ............................. 365/191
6,011,447 A * 1/2000 Iwasaki ....................... 331/185

* cited by examiner

Primary Examiner—Tuan T. Lam
(74) Attorney, Agent, or Firm—Adams & Wilks

(57) ABSTRACT

A latch circuit is arranged by means for detecting a signal, a unit for holding a signal detection condition, and a unit for releasing the signal detection condition. When a detection output produced from the detecting unit is entered into the signal detection condition holding unit, the signal detection condition holding unit continuously holds the detection condition until a power supply is interrupted even when the detection output is not entered thereinto. The signal detection condition releasing unit produces a release signal only when the power supply is turned ON. Once the signal detection condition holding unit holds the signal detection condition, the signal detection condition holding unit is reset to an undetection condition only when the power supply is interrupted and then is again turned ON. The latch circuit can firmly reset the stopped system to the initial condition by merely again turning ON the power supply. In addition the stopped system is not unnecessarily reset until the power supply is interrupted. As a consequence, it is possible to obtain the safety operation as well as the firm operation of the circuit and the system.

12 Claims, 11 Drawing Sheets

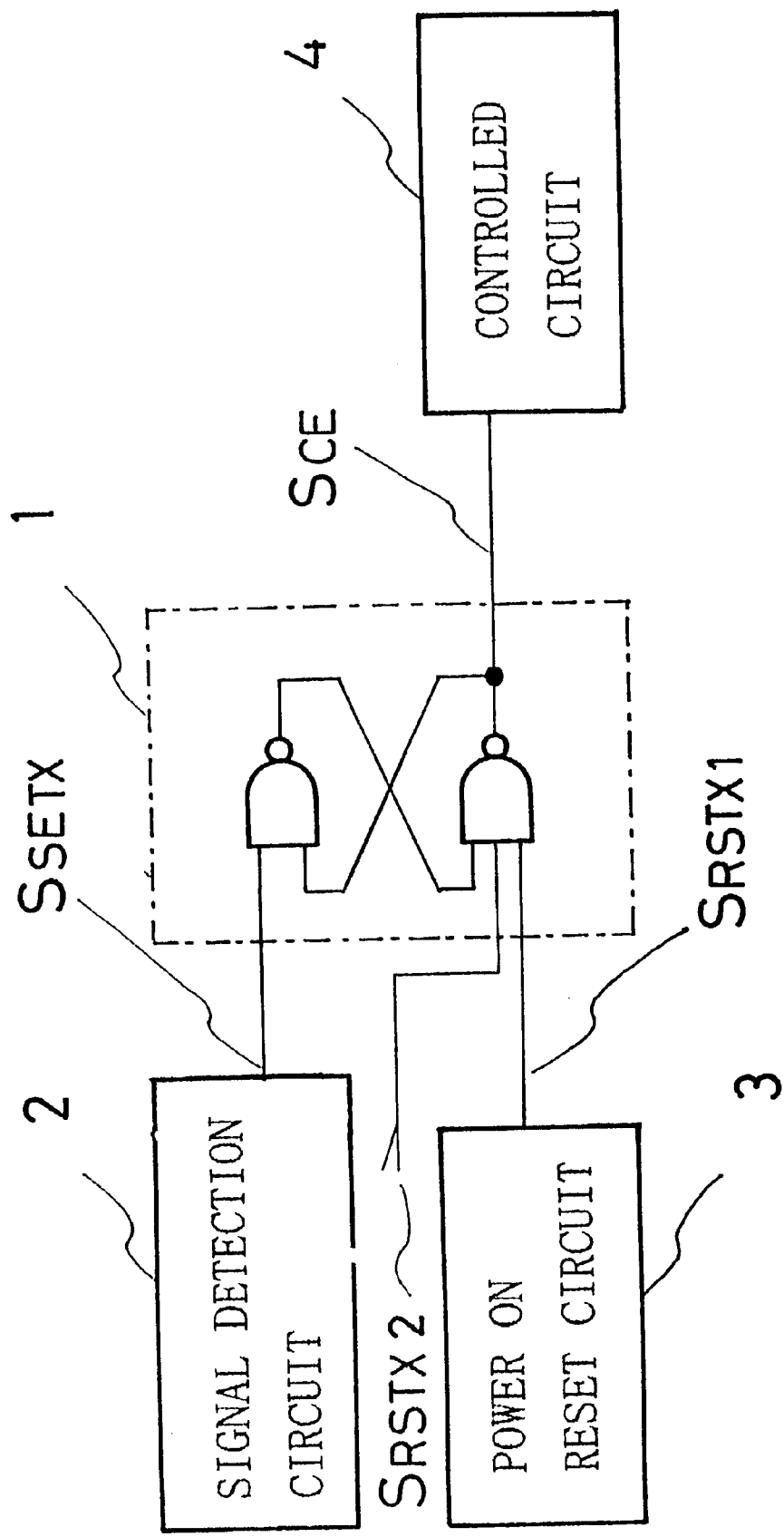
PRIOR ART FIG. 10

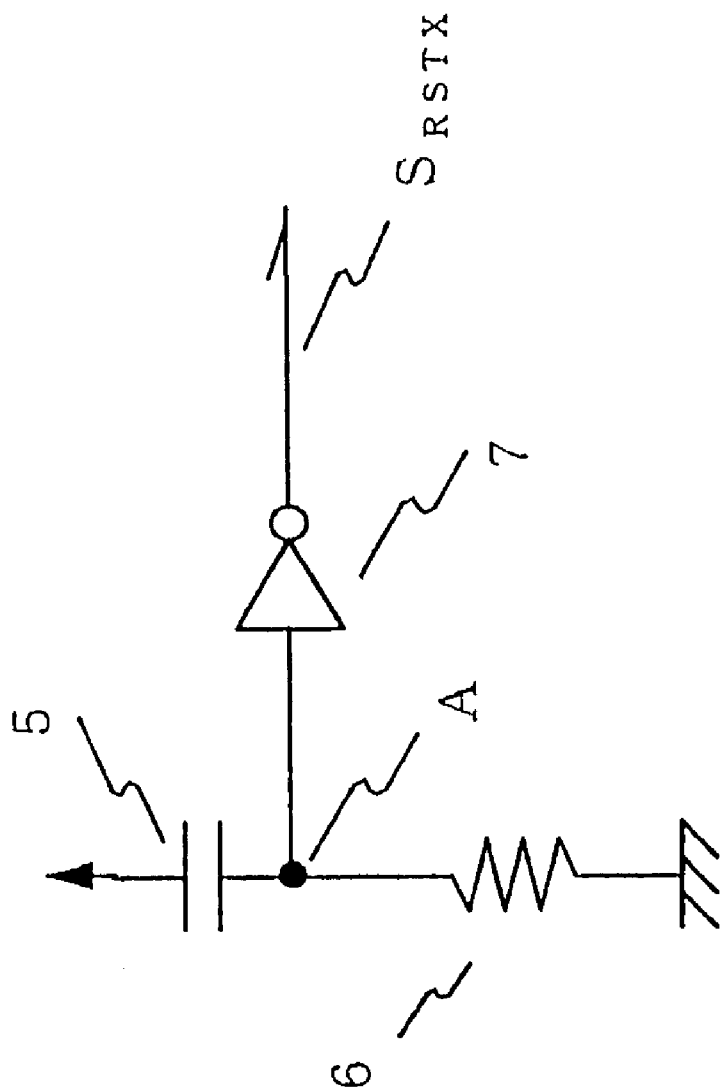
PRIOR ART FIG. 11

LATCH CIRCUIT

BACKGROUND OF THE INVENTION

1. Field of the Invention

The present invention is related to a latch circuit constituted by a signal detecting circuit, a circuit for firmly holding this signal detection state until a power supply is interrupted, and a circuit for firmly releasing the signal detection state when the power supply is again turned ON.

2. Description of the Related Art

Conventionally, a latch circuit capable of holding a signal detection state is typically arranged as shown in a circuit arrangement of FIG. 10 when an RS latch circuit is generally employed.

Referring now to the drawing, the conventional latch circuit will be explained.

First, a signal detecting circuit 2 detects an abnormal voltage of a specific terminal, an abnormal voltage of a power supply, and also an abnormal temperature. A detection output "$S_{SETX}$" of this voltage detecting circuit 2 becomes an "L" level, namely active, and is connected to an SX terminal of an RS latch 1. The RS latch 1 is constituted by a 2-input NAND gate and a 3-input NAND gate. When the voltage detecting circuit 2 detects an abnormal voltage and an abnormal temperature, an output $S_{CE}$ of the 3-input NAND gate which constitutes the output of this RS latch 1 becomes an "L" level. At this time, both a signal "$S_{RSTX1}$" and another signal "$S_{RSTX2}$" are set to an "H" level, which are entered into the reset input of the RS latch 1. The output signal of the RS latch 1 constitutes an enable signal of another circuit, and also an enable signal of a system. For example, when the signal detecting circuit 2 detects that a short-circuit has occurred in a specific terminal, an abnormal heating phenomenon, or the like, the RS latch 1 causes operation of these failure circuits and systems to be stopped.

To again activate such a system which has stopped operating, the externally supplied reset signal $S_{RSTX2}$ is input to the RS latch 1. Alternatively, since the power supply is again turned ON, the RS latch 1 is reset by receiving the signal $S^{RSTX1}$ corresponding to the output signal of the power-ON reset circuit 3.

In general, there are some cases that a power-ON reset circuit may not firmly produce a reset signal, depending upon conditions occurring when a power supply is turned ON. As a result, even when such a power-ON reset circuit is not operable, a reset signal may be externally entered into a conventional latch circuit in order that an uncontrolled circuit may be reset.

For instance, in the case of a power-ON reset circuit shown in FIG. 11, when a power supply is turned ON, a potential of a node "A" is risen up to such a potential nearly equal to a power supply voltage because of a capacitive coupling phenomenon by a capacitor 5. Thereafter, electron charges stored in the capacitor 5 are extracted therefrom by resistor 6, so that the potential at the node A is decreased. Then, when this potential becomes lower than, or equal to an inverting voltage of an inverter 7 provided at a next stage, the output signal $S_{RSTX}$ of the power-ON reset circuit becomes an "H" level, and the reset signal is released.

In such a power-ON reset circuit, if the power supply voltage is risen at a slower speed than such a speed that the electron charges of the capacitor 5 are extracted by resistor 6, then this power-ON reset circuit cannot produce the reset signal.

However, when the power-ON reset circuit is arranged by having the externally entered reset input, the terminal for receiving such an externally-supplied reset signal is additionally required, or the circuit capable of recognizing the reset command must be employed. Furthermore, there are certain possibilities that releasing operation of the latching action happens to occur, which is not originally required, due to noise contained in the signal. As a result, this may deteriorate reliability of the system.

SUMMARY OF THE INVENTION

The present invention has been made to solve the above-described problem of the conventional reset circuit, and therefore, has an object to provide a reliable reset circuit.

To solve the problem as described above, according to a first aspect of the present invention, there is provided a latch circuit comprising means for detecting a signal, means for holding a signal detection condition and means for releasing the signal detection condition, characterized in that when a detection output produced from the detecting means is entered into the signal detection condition holding means, the signal detection condition holding means continuously holds the detection condition until a power supply is interrupted even when the detection output is not entered thereinto, the signal detection condition releasing means produces a release signal only when the power supply is turned ON, and once the signal detection condition holding means holds the signal detection condition, the signal detection condition holding means is reset to an undetection condition only when the power supply is interrupted and then is again turned ON.

According to the present invention as set forth in the first aspect thereof, since the signal and the command are not externally input so as to reset the latch circuit, this latch circuit may not be unnecessarily reset due to noise, etc.

Further, in a latch circuit according to a second aspect of the present invention, the latch circuit is characterized in that while the signal detection condition holding means holds the detection condition, the latch circuit stops operation of a circuit into which the output signal of the signal detection condition holding means is inputted.

According to the present invention as set forth in the second aspect thereof, once the signal condition detecting means detects the abnormal condition to latch the latch circuit, the system and the circuit are firmly stopped until the power supply is again turned ON. As a consequence, it is possible to avoid such an unstable condition where the latch circuit is unwantedly reset and both the activation and deactivation of the circuit and system are repeatedly carried out.

Further, in a latch circuit according to a third aspect of the present invention, the latch circuit is characterized in that the signal detection condition releasing means is comprised of means for detecting a power supply voltage, means for determining producing time of a release signal and means for shaping a waveform, whereby the signal detection condition releasing means is equal to a power-ON reset circuit operated in such a manner that the release signal is continuously output after the power supply is turned ON until a preselected time period has passed, or the power supply voltage has reached a constant power supply voltage.

According to the present invention as set forth in the third aspect thereof, any of the pulse width of the reset signal and of the power supply voltage can be optimized. This reset signal is used to reset the RS latch employed in the latch circuit. For instance, even when the power supply voltage is gradually raised, the power-ON reset circuit can continuously output the reset signal until the power supply voltage is increased up to such a voltage at which the circuit can be sufficiently operated. Even when the power supply voltage is rapidly raised, since the sufficiently wide pulse width of the signal capable of resetting the latch circuit can be secured, the RS latch can be firmly reset by merely turning ON the power supply again, without employing such a means for inputting the externally-supplied reset signal.

Further, in a latch circuit according to a fourth aspect of the present invention, the latch circuit is characterized in that the power supply voltage detecting means included in the power-ON reset circuit is constituted by a depletion-mode N-channel MIS transistor and an enhancement-mode P-channel MIS transistor, both a gate and a source of the depletion-mode N-channel MIS transistor are connected to the ground potential, a drain of the depletion-mode N-channel MIS transistor is commonly connected to a drain of the enhancement-mode P-channel MIS transistor, which constitutes an output terminal of the power supply voltage detecting means, and a source of the enhancement-mode P-type MIS transistor is connected to the power supply potential, a gate thereof is feedback-connected to the output of the power-ON reset circuit, and the latch circuit controls to turn ON the enhancement-mode P-channel MIS transistor only while the power-ON reset circuit produces a signal for releasing the detection condition.

According to the present invention as set forth in the fourth aspect thereof, in the power supply voltage detecting circuit, after the power supply voltage is increased higher than, or equal to the threshold voltage of the enhancement-mode P-channel MIS transistor, the output of the power supply voltage detecting circuit is increased from the ground potential. Furthermore, the power-ON reset circuit consumes the electric power only in the following case. That is, while this power-ON reset circuit produces the reset signal, only the penetration current flowing through both the enhancement-mode P-channel MIS transistor and the depletion-mode N-channel MIS transistor consumes the electric power. After the reset signal has been increased up to necessary time, or necessary power supply voltage, since the enhancement-mode P-channel MIS transistor is turned OFF, the circuit is brought into a static condition, so that the latch circuit may consume only very low electric power except when the power supply is turned ON.

Further, in a latch circuit according to a fifth aspect of the present invention, the latch circuit is characterized in that an absolute value of a threshold voltage of the P-channel MIS transistor which constitutes the power supply voltage detecting means included in the power-ON reset circuit is made higher than an absolute value of a threshold voltage of the P-channel MIS transistor and also an absolute value of a threshold voltage of the N-channel MIS transistor, which constitute the signal detection condition holding means.

According to the present invention as set forth in the fifth aspect thereof, since the power supply voltage detecting circuit continuously outputs the ground potential until such a power supply voltage under which the Rs latch circuit holding the detection condition is operated under stable condition, the latch circuit can be firmly reset by the produced reset signal.

Further, in a latch circuit according to a sixth aspect of the present invention, the latch circuit is characterized in that the release signal producing time determining means included in the power-ON reset circuit is constituted by a first capacitor, one terminal of which is connected to a power supply potential, a depletion-mode N-channel MIS transistor having a drain connected to another terminal of the first capacitor, a first enhancement-mode N-channel MIS transistor having a drain commonly connected to both a gate and a source of the depletion-mode N-channel MIS transistor, an inverter circuit having an input which corresponds to a junction point between the first capacitor and the drain of the depletion-mode N-channel MIS transistor, a second capacitor connected between an output terminal of the inverter circuit and the ground potential and a second enhancement-mode N-channel MIS transistor in which the output terminal of the inverter circuit is connected to a gate thereof, a drain thereof is connected to the input of the inverter circuit, and a source thereof is connected to the ground potential; wherein the gate of the first enhancement-mode N-channel MIS transistor is connected to the output terminal of the voltage detecting means and an output of the inverter circuit constitutes the output of the release signal producing time determining means.

According to the present invention as set forth in the sixth aspect thereof, the output of the power supply voltage detecting means as set forth in the third and fourth aspect thereof is connected to the gate of the first enhancement-mode N-channel MIS transistor so as to control the ON/OFF state of this MIS transistor. AS a result, until the output voltage of the power supply voltage detecting means becomes higher than the threshold voltage of the first enhancement-mode N-channel MIS transistor, the potential at the junction point between the first capacitor and the depletion-mode N-channel MIS transistor is maintained at a potential nearly equal to the power supply potential, and the power-ON reset circuit continuously outputs the reset signal. Furthermore, after the first enhancement-mode N-channel MIS transistor has been turned ON, since the electron charges stored in the first capacitor are extracted by way of the depletion-mode N-channel IS transistor functioning as the constant current element, the potential at another terminal of the first capacitor is gradually decreased. Then, the reset signal is output until this potential is decreased lower than, or equal to, the inverting voltage of the inverter connected at the next stage.

Further, in a latch circuit according to a seventh aspect of the present invention, the latch circuit is characterized in that the inverter circuit included in the release signal producing time determining means is constituted by an enhancement-mode P-channel MIS transistor and an enhancement-mode N-channel MIS transistor; and an absolute value of a threshold voltage of the enhancement-mode P-channel MIS transistor is made higher than an absolute value of a threshold voltage of the P-channel MIS transistor and also higher than an absolute value of a threshold voltage of the N-channel MIS transistor, which constitute the signal detection condition holding means.

According to the present invention as set forth in the seventh aspect thereof, under such a very low voltage condition that the circuit operation becomes unstable, as to the P-channel MIS transistor and the N-channel MIS transistor, which constitute the inverter, the N-channel MIS transistor is always and easily turned ON in advance. The inverter readily outputs the "L" level signal. As a consequence, the power-ON reset circuit can more firmly output the reset signal when the power supply is turned ON.

Further, in a latch circuit according to an eighth aspect of the present invention, the latch circuit is characterized in that the inverter circuit included in the release signal producing time determining means is constituted by an enhancement-mode P-channel MIS transistor and an enhancement-mode N-channel MIS transistor; and an absolute value of a threshold voltage of the enhancement-mode N-channel MIS transistor is made lower than an absolute value of a threshold voltage of the P-channel MIS transistor and also lower than an absolute value of a threshold voltage of the N-channel MIS transistor, which constitute the signal detection condition holding means.

According to the present invention as set forth in the eighth aspect thereof, under such a very low voltage condition that the circuit operation becomes unstable, as to the P-channel MIS transistor and the N-channel MIS transistor, which constitute the inverter, the N-channel MIS transistor is always and easily turned ON in advance. The inverter readily outputs the "L" level signal. As a consequence, the power-ON reset circuit can more firmly output the reset signal when the power supply is turned ON.

Further, in a latch circuit according to a ninth aspect of the present invention, the latch circuit is characterized in that the signal detected by the signal detecting means is used to detect that the power supply voltage is lower than, or equal to a specific voltage.

According to the present invention as set forth in the ninth aspect thereof, the operation of the system can be firmly stopped in the case that the operation voltage is out of the power supply voltage range where the circuit can be operated under stable condition. Thus, operational runaway of the system can be avoided.

Further, in a latch circuit according to a tenth aspect of the present invention, the latch circuit is characterized in that the signal detected by the signal detecting means is used to detect that the power supply voltage is higher than, or equal to a specific voltage.

According to the present invention as set forth in the tenth aspect thereof, the operation of the system can be firmly stopped in the case that the operation voltage is out of the power supply voltage range where the circuit can be operated under stable condition. Thus, operational runaway of the system can be avoided.

Further, in a latch circuit according to an eleventh aspect of the present invention, the latch circuit is characterized in that the signal detected by the signal detecting means is used to detect that a voltage of a specific terminal is lower than, or equal to a specific voltage.

According to the present invention as set forth in the eleventh aspect thereof, for example, even when an output of a regulator circuit is short-circuited, the latch circuit can firmly stop operation of the system, and also can surely avoid break-down and operational runaway of the circuit.

Further, in a latch circuit according to a twelfth aspect of the present invention, the latch circuit is characterized in that the signal detected by the signal detecting means is used to detect that a voltage of a specific terminal is higher than, or equal to a specific voltage.

According to the present invention as set forth in the twelfth aspect thereof, for example, even when an excessively high voltage is applied to a specific input terminal, the latch circuit can firmly stop operation of the system, and also can surely avoid break-down and operational runaway of the circuit.

Further, in a latch circuit according to a thirteenth aspect of the present invention, the latch circuit is characterized in that the signal detected by the signal detecting means is used to detect that an ambient temperature, or a temperature of a semiconductor substrate where the latch circuit is constituted is higher than a specific temperature.

According to the present invention as set forth in the thirteenth aspect thereof, even when the ambient temperature, or the temperature of the semiconductor substrate is increased higher than the necessary temperature, the latch circuit can firmly stop operation of the system, and also can surely avoid break-down and operational runaway of the circuit.

Further, in a latch circuit according to a fourteenth aspect of the present invention, the latch circuit is characterized in that the signal detected by the signal detecting means is used to detect that an ambient temperature, or a temperature of a semiconductor substrate where the latch circuit is constituted is lower than a specific temperature.

According to the present invention as set forth in the fourteenth aspect thereof, even when the ambient temperature, or the temperature of the semiconductor substrate is increased lower than the necessary temperature, the latch circuit can firmly stop operation of the system. In general, when the temperature is low in an MIS type integrated circuit, this MIS type integrated circuit easily produce noise, and/or may readily become sensitive with respect to this noise. As a result, this latch circuit can avoid erroneous operation.

Further, in a latch circuit according to a fifteenth aspect of the present invention, the latch circuit is characterized in that a circuit which is stopped while the signal detection condition holding means holds the detection condition corresponds to a voltage detecting circuit.

According to the present invention as set forth in the fifteenth aspect thereof, even when the voltage of the detected signal is oscillated at the voltage nearly equal to the detection voltage of the voltage detecting circuit, the latch circuit can surely stop operation of the system.

Further, in a latch circuit according to a sixteenth aspect of the present invention, the latch circuit is characterized in that a circuit which is stopped while the signal detection condition holding means holds the detection condition, corresponds to a temperature detecting circuit.

According to the present invention as set forth in the sixteenth aspect thereof, even when the ambient temperature, or the temperature of the semiconductor substrate is vibrated near the detection temperature, the latch circuit can firmly stop operation of the system.

Further, in a latch circuit according to a seventeenth aspect of the present invention, the latch circuit is characterized in that a circuit which is stopped while the signal detection condition holding means holds the detection condition corresponds to a series-type voltage regulating circuit.

According to the present invention as set forth in the seventeenth aspect thereof, for instance, when the output of the series-type regulating circuit is short-circuited, since the latch circuit can stop operation of the system by detecting such a short-circuit condition, both break-down and operational runaway can be avoided.

Further, in a latch circuit according to an eighteenth aspect of the present invention, the latch circuit is characterized in that a circuit which is stopped while the signal detection condition holding means holds the detection condition corresponds to a switching type voltage regulating circuit.

According to the present invention as set forth in the eighteenth aspect thereof, for instance, when the output of the switching-type regulating circuit is short-circuited, since the latch circuit can stop operation of the system by detecting such a short-circuit condition, both break-down and operational runaway can be avoided.

BRIEF DESCRIPTION OF THE DRAWINGS

The better understanding of the present invention may be made by reading a detailed description in conjunction with the accompanying drawings, in which:

FIG. 10 is a block diagram for showing the circuit arrangement of the conventional latch circuit; and FIG. 11 is a circuit diagram for representing one example of the power-ON reset circuit used in the conventional latch circuit.

DETAILED DESCRIPTION OF THE PREFERRED EMBODIMENTS

Referring now to drawings, a description will be made of latch circuits according to embodiments 1 to 9 of the present invention.

Embodiment 1

Figure 1:
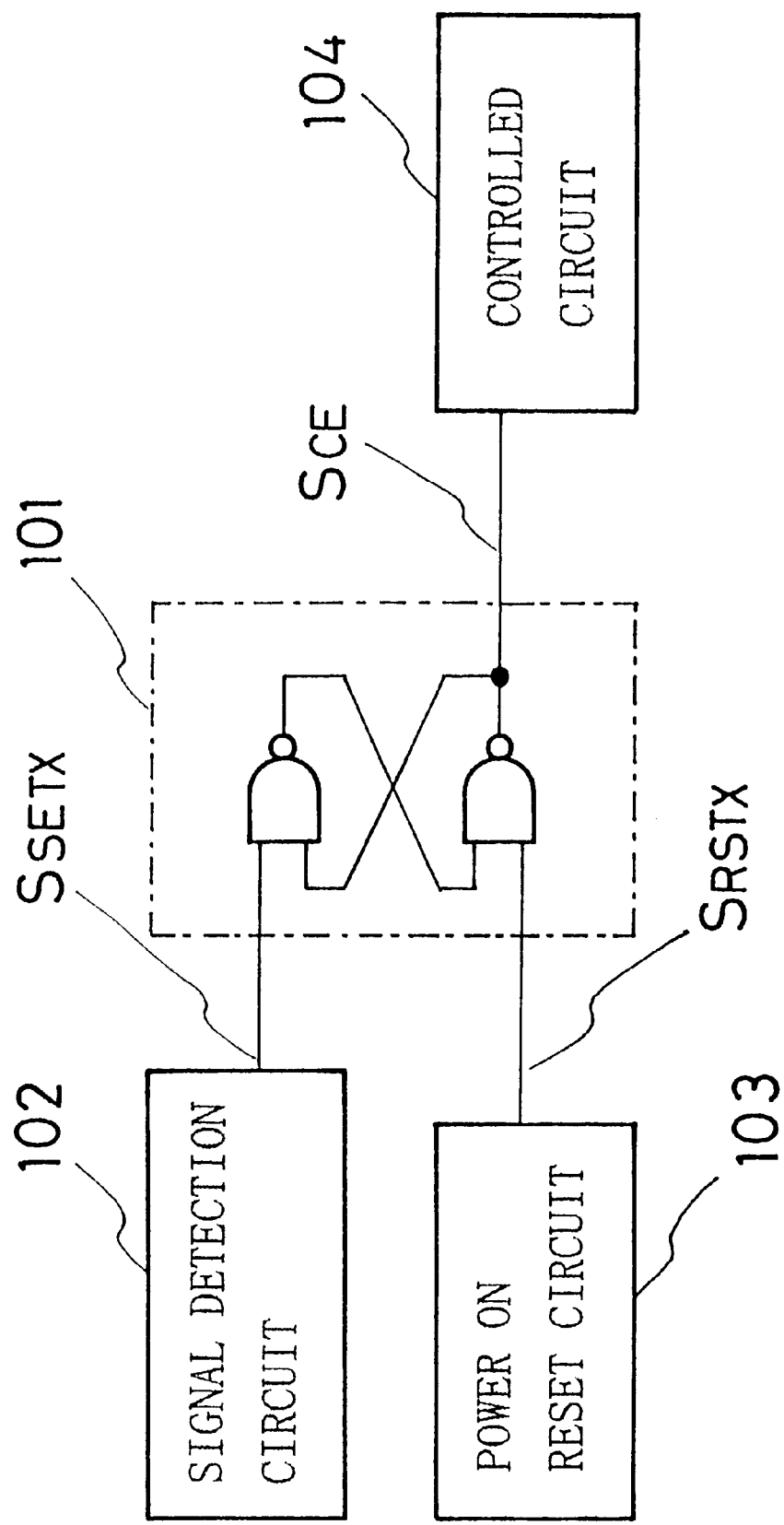
FIG. 1 is a block diagram for showing a circuit arrangement of a latch circuit according to Embodiment 1 of the present invention.

FIG. 1 is a schematic block diagram for showing a circuit arrangement of a latch circuit according to Embodiment 1 of the present invention.

An RS latch 101 is constituted by two sets of 2-input NAND gates. This RS latch 101 owns only one set input and only one reset input.

A signal "$SS_{SETX}$" corresponding to an output of a signal detecting circuit 102 is entered into the one set input of this RS latch 101. Since the signal $S_{SETX}$ becomes an "L" level, the RS latch 101 holds a detection state. The signal detecting circuit 102 detects, for instance, a specific voltage, a specific current, or a specific temperature, and then changes the output thereof.

When the RS latch 101 is brought into the detection state, an output signal "$S_{CE}$" becomes an "L" level, and a circuit to be controlled 104 whose operation is controlled by the signal $S_{CE}$ is brought into an operation stop state.

In order that the RS latch 101 releases the detection state and also the circuit to be controlled 104 whose operation is stopped is again brought into the operation state, an output signal "$S_{RSTX}$" of a power-ON reset circuit 103 must output an "L" level, so that the RS latch 101 is transferred from the set state to the reset state.

Since the power-ON reset circuit 103 outputs an L-leveled pulse only when the power supply is turned ON, the latch circuit shown in FIG. 1 releases the signal detection state which has been held only when the power supply is turned ON.

As previously described, since the latch circuit according to Embodiment 1 is constituted by employing the above-explained circuit arrangement, the following operations never occur. That is, the latching operation is undesirably released by the noise and the like, and the circuit to be controlled brought into the stop condition is unnecessarily activated. As a result, the safety characteristic of the latch circuit can be improved.

Emboidment 2

Figure 2:
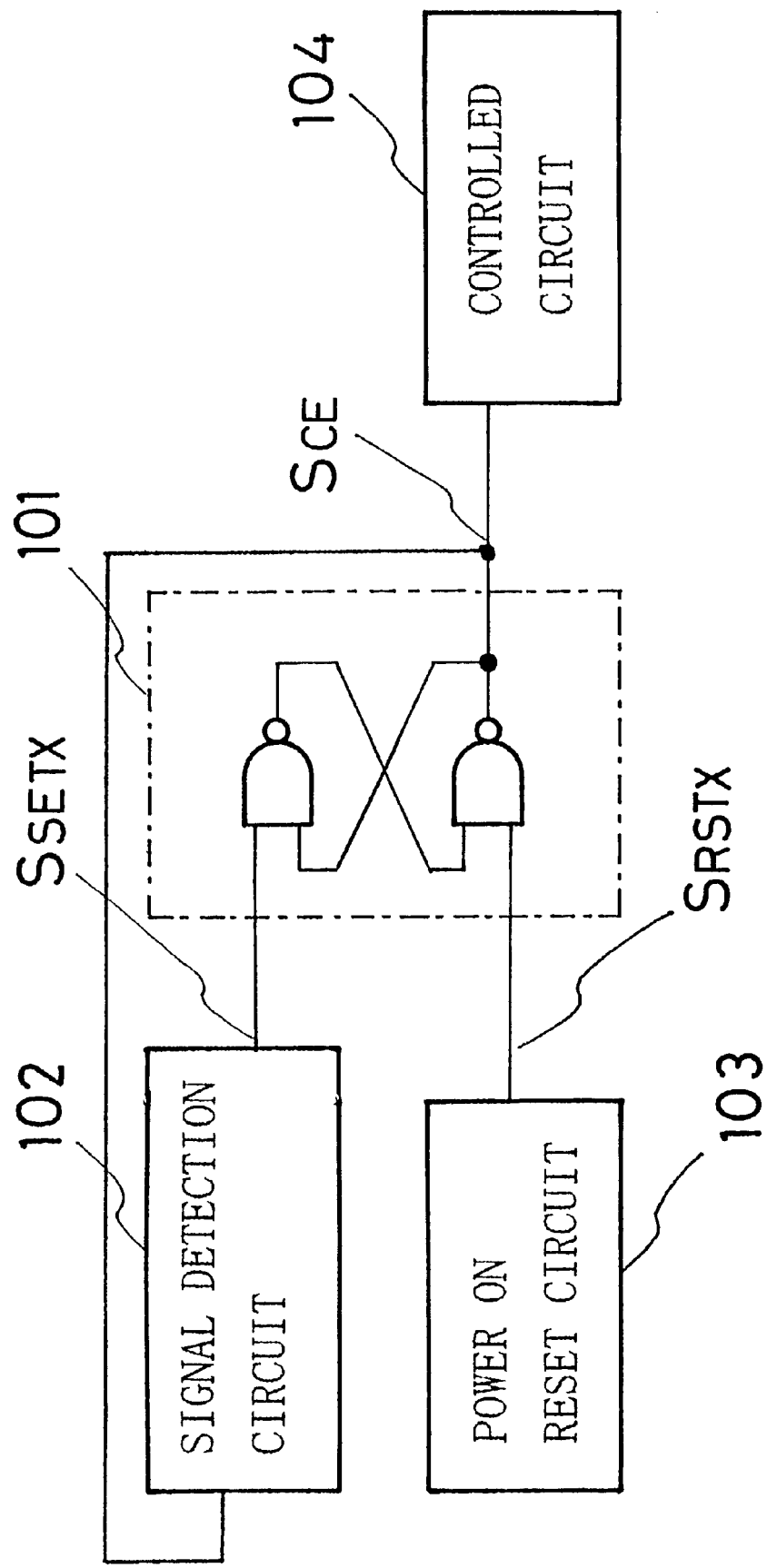
FIG. 2 is a block diagram for showing a circuit arrangement of a latch circuit according to Embodiment 2 of the present invention.

FIG. 2 is a schematic block diagram for representing a circuit arrangement of a latch circuit according to Embodiment 2 of the present invention.

A basic arrangement and also a basic operation of this second latch circuit are similar to those of Embodiment 1. However, in this second latch circuit, the output signal "$S_{CE}$" of the RS latch 101 is used also to control the operation of the signal detecting circuit 102. That is to say, when the signal detecting circuit 102 detects a certain signal, so that the RS latch 101 holds the detection state, the operation of the signal detecting circuit 102 is also stopped in a similar manner to the circuit to be controlled 104.

Since the signal detecting circuit 102 continuously consumes the current while being operated, it is possible to reduce the current consumption occurred while the latch circuit according to Embodiment 2 holds the detection state by employing the above-explained circuit arrangement.

Embodiment 3

Figure 3:
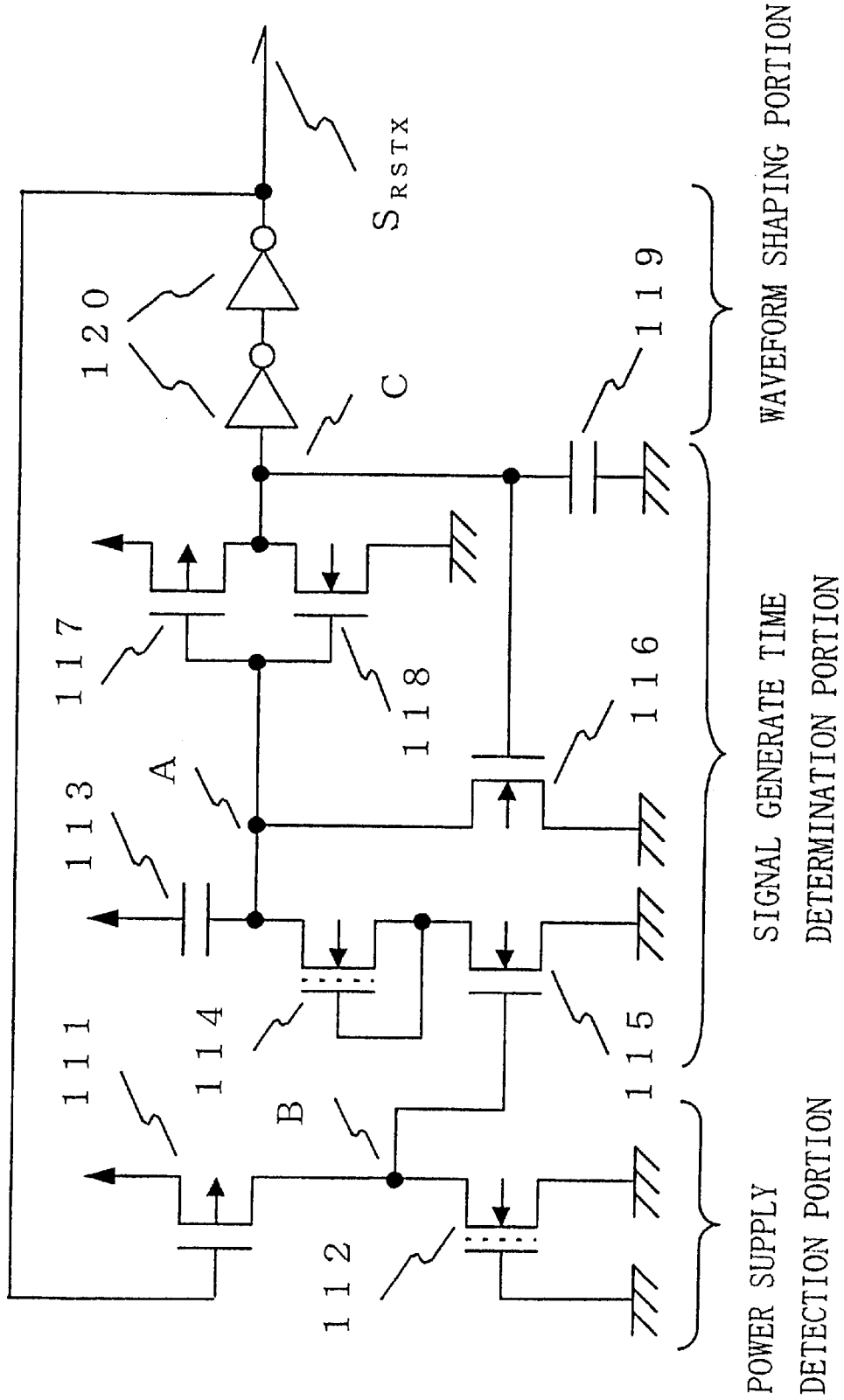
FIG. 3 is a circuit diagram for representing a first circuit example of the power-ON reset circuits indicated in FIG. 1 and FIG. 2, which constitutes Embodiment 3 of the present invention.

FIG. 3 is a detailed circuit diagram for indicating a power-ON reset circuit used in the latch circuits according to Embodiments 1 and 2 of the present invention.

That is, this power-ON reset circuit according to Embodiment 3 is arranged by a power supply voltage detecting unit, a reset signal producing time determining unit, and a waveform shaping unit. The power supply voltage detecting unit is constituted by an enhancement-mode P-channel MIS transistor 111 and a depletion-mode N-channel MIS transistor 112. The reset signal producing time determining unit is constituted by a capacitor 113, another capacitor 119, a depletion-mode N-channel MIS transistor 114, enhancement-mode N-channel MIS transistors 115 and 116, an enhancement-mode P-channel MIS transistor, and also another enhancement-mode N-channel MIS transistor. The waveform shaping unit is constituted by two sets of inverters 120.

In the power supply voltage detecting unit, during initial time period after the power supply is turned ON, since the gate of the enhancement-mode P-channel MIS transistor 111 becomes an "L" level, when the voltage between the gate and the source of this MIS transistor exceeds a threshold voltage, namely when the power supply voltage exceeds the threshold voltage of the enhancement-mode P-channel MIS transistor 111, a potential at a point B starts to be increased. Also, since the output signal of the power-ON reset circuit is feedback-connected to the gate of this enhancement-mode P-channel MIS transistor 111, when outputting of a reset pulse is ended, this enhancement-mode P-channel MIS transistor 111 is turned OFF, so that the power supply voltage detecting unit does not consume the current.

In the reset signal producing time determining unit, when the power supply is turned ON, a potential at a point A is increased to a power supply voltage level by way of capacitive coupling of the capacitor 113. At this time, since the enhancement-mode N-channel MIS transistor 115 is turned OFF before the output of the power supply voltage detecting unit is increased from an "L" level, there is no such a path used to extract the electron charges at the point A to the ground side. As a result, the potential at the point A is increased up to such a voltage level substantially equal to the power supply voltage level while following this power supply voltage level. Thereafter, when the potential at the point B starts to be increased, the electron charges stored in the point A are extracted by a constant current value by the depletion-mode N-channel MIS transistor 114 functioning as a constant current element. Then, when the potential at the point A becomes lower than, or equal to an inverting voltage of such an inverter circuit arranged by the enhancement-mode P-channel MIS transistor 117 and the enhancement-mode N-channel MIS transistor 118, the potential at another point "C" is changed from an "L" level to an "H" level, and also the electron charges stored at the point A are entirely extracted by the enhancement-mode N-channel MIS transistor, so that the generation of the reset pulse can be firmly ended.

At this time, the generation time of the reset pulse may be determined based upon both the capacitance value of the capacitor 113 and the constant current value determined by the depletion-mode N-channel MIS transistor.

Also, since the capacitor 119 owns such an effect that the potential at the point C is extracted to the ground side when the power supply is turned ON, there is an advantage that the reset signal can be produced under stable condition.

In this power-ON reset circuit, in such a case that the power supply voltage is very slowly increased, this power-ON reset circuit continuously produces the reset signal until the power supply potential is increased up to the detection voltage determined by the power supply voltage detecting unit. Also, in such a case that the power supply voltage is quickly raised, the power-ON reset circuit produces the reset signal for a sufficiently long time duration during which a resettable circuit performs the resetting operation, which is determined by the reset signal producing time determining unit. As a result, the power-ON reset circuit can firmly produce the reset signal even under any conditions, and can reset the circuits connected to the own power-ON reset circuit.

Embodiment 4

Figure 4:
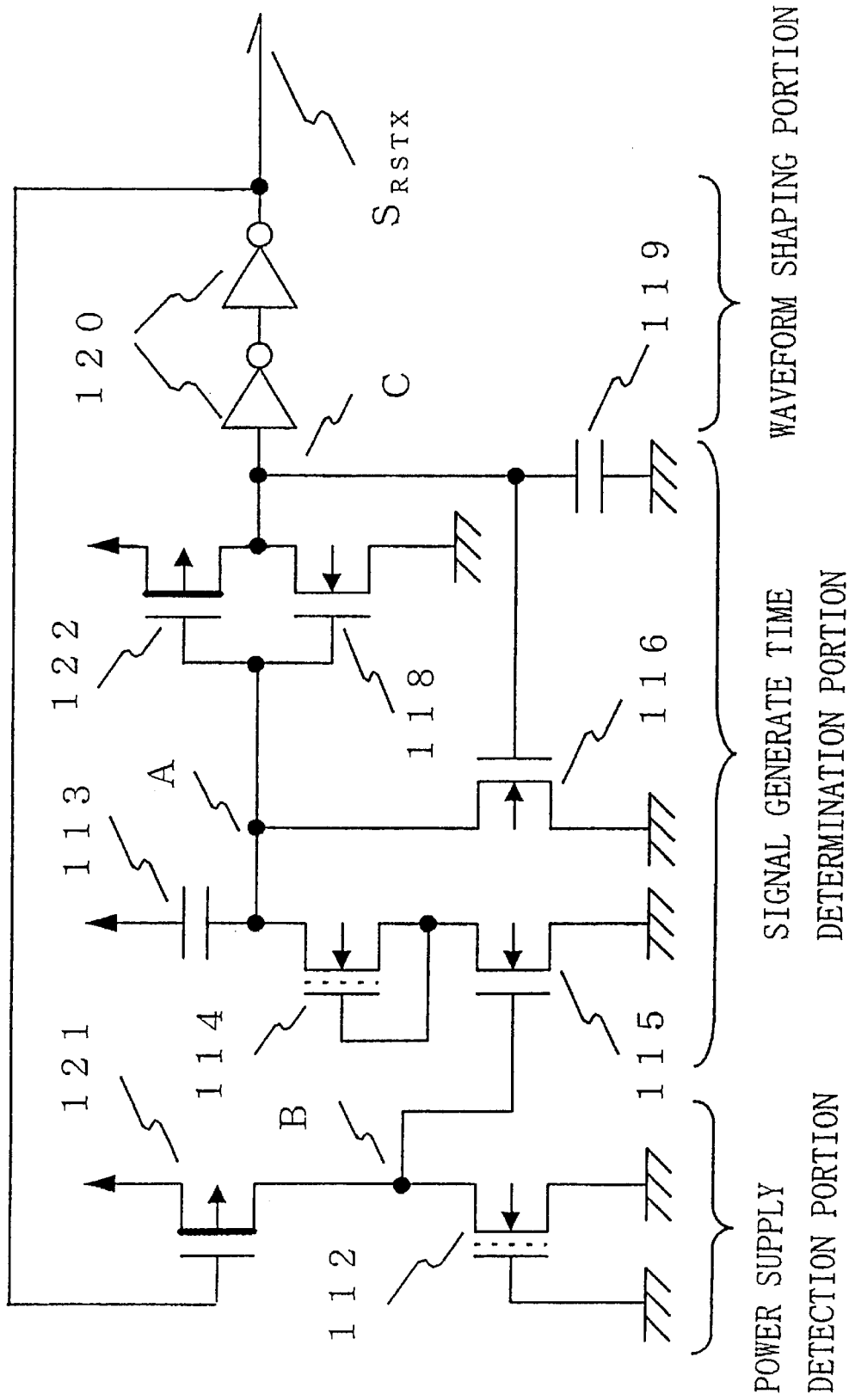
FIG. 4 is a circuit diagram for representing a second circuit example of the power-ON reset circuits indicated in FIG. 1 and FIG. 2, which constitutes Embodiment 4 of the present invention.

FIG. 4 is a detailed circuit diagram for indicating a power-ON reset circuit used in the latch circuits according to Embodiments 1 and 2 of the present invention.

In this power-ON reset circuit according to Embodiment 4 of the present invention, as enhancement-mode P-channel MIS transistors 121 and 122, such MIS transistors are employed. That is, absolute values of threshold voltages are higher than those of Embodiment 3.

First, since the absolute value of the threshold voltage of the enhancement-mode P-channel MIS transistor 121 is set higher than absolute values of threshold voltages of MIS transistors which constitute the inverter 120 and the RS latch 111, the power-ON reset circuit can continuously output the reset signal until the power supply voltage is increased up to such a voltage at which the inverter 120 and the RS latch 111 are operable under normal operation. As a result, the power-ON reset circuit can firmly reset such a circuit to which the reset signal is entered.

Furthermore, since the absolute value of the threshold voltage of the enhancement-mode P-channel MIS transistor 122 is set higher than absolute values of threshold voltages of MIS transistors which constitute the inverter 120 and the RS latch 111, and also an absolute value of a threshold voltage of the enhancement-mode N-channel MIS transistor 118, this enhancement-mode N-channel MIS transistor 118 can be turned ON earlier than the enhancement-mode P-channel MIS transistor 122, under such a unstable condition of the circuit operation when the power supply is turned ON, so that the potential at the point C can be easily drawn to the ground potential. As a result, the power-ON reset circuit can firmly produce the reset signal. Also, a similar effect may be achieved even when the absolute value of the threshold voltage of the enhancement-mode N-channel MIS transistor 118 is made lower than the absolute values of the threshold voltages of the transistors which constitute the inverter 120 and the RS latch 111.

Embodiment 5

Figure 5:
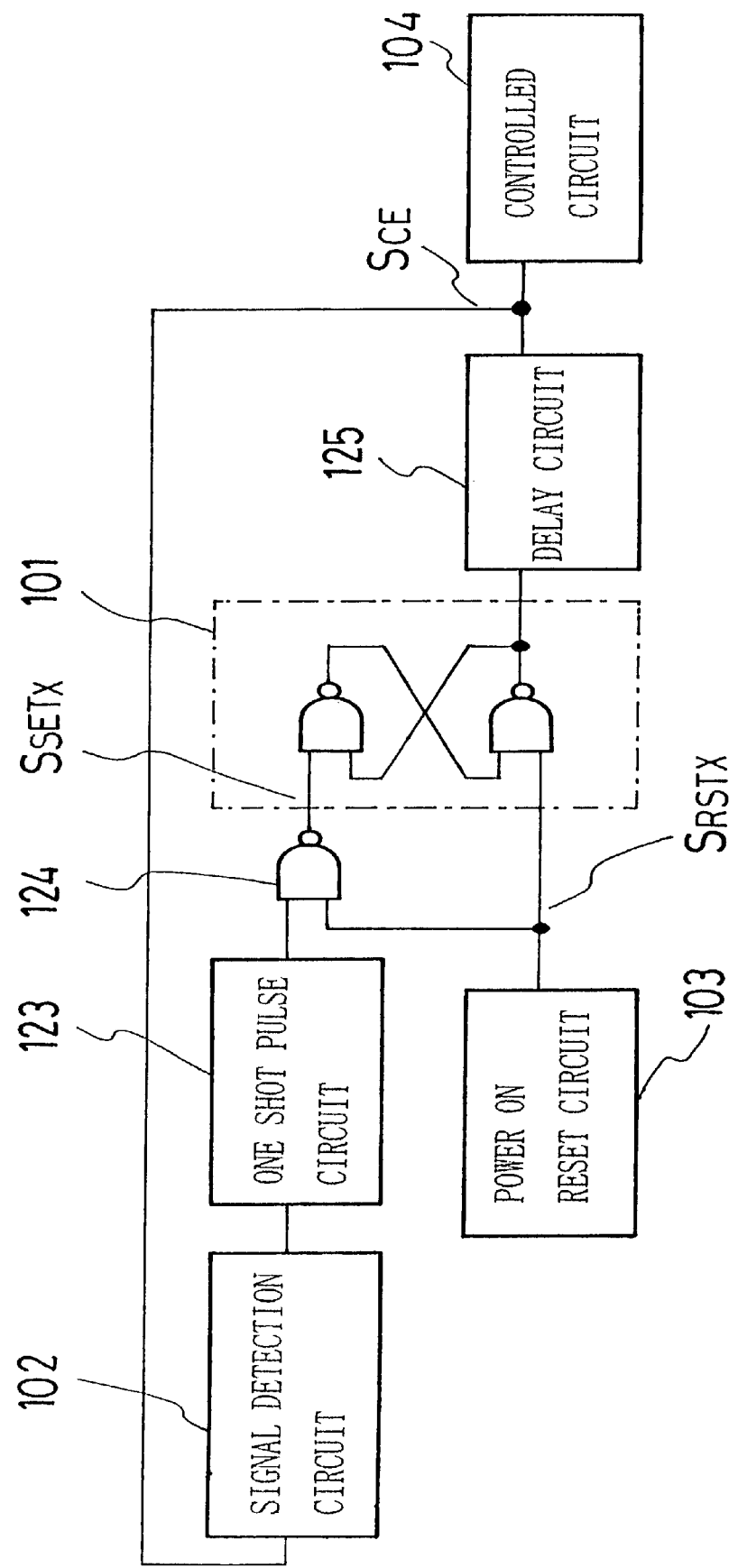
FIG. 5 is a block diagram for indicating a circuit arrangement of a latch circuit according to Embodiment 5 of the present invention.

FIG. 5 is a schematic block diagram for indicating a circuit arrangement of a latch circuit according to Embodiment 5 of the present invention.

The circuit arrangement of this fifth latch circuit is made by adding a one-shot pulse circuit 123, a 2-input NAND gate 124, and a delay circuit 125 to the latch circuit of Embodiment 2.

When both the normal set input signal and the reset input signal are inputted to the RS latch 101 at the same time, since the output of this RS latch 101 is brought into an uncertain condition, the reset signal with a top priority is entered into the RS latch 101 by using the 2-input NAND gate 124.

As a similar solution, the signal detecting circuit 102 detects only one of the output changes, namely from an "L" level to an "H" level, or from an "H" level to an "L" level. Then, the one-shot pulse circuit 123 produces the set pulse only for a time period required to set to the RS latch when the output level is changed.

The delay circuit 125 owns an effect capable of avoiding such a fact that since a signal "$S_{CE}$" corresponding to an enable signal is fed back at a very earlier stage, the signal detecting circuit 102 stops the signal detecting operation thereof while this signal detecting operation is still continued.

With employment of such a circuit arrangement, the latch circuit of this embodiment 5 can firmly stop the system in the safety manner when an abnormal condition happens to occur, and also can surely restart the operation by again turning ON the power supply.

Embodiment 6

Figure 6:
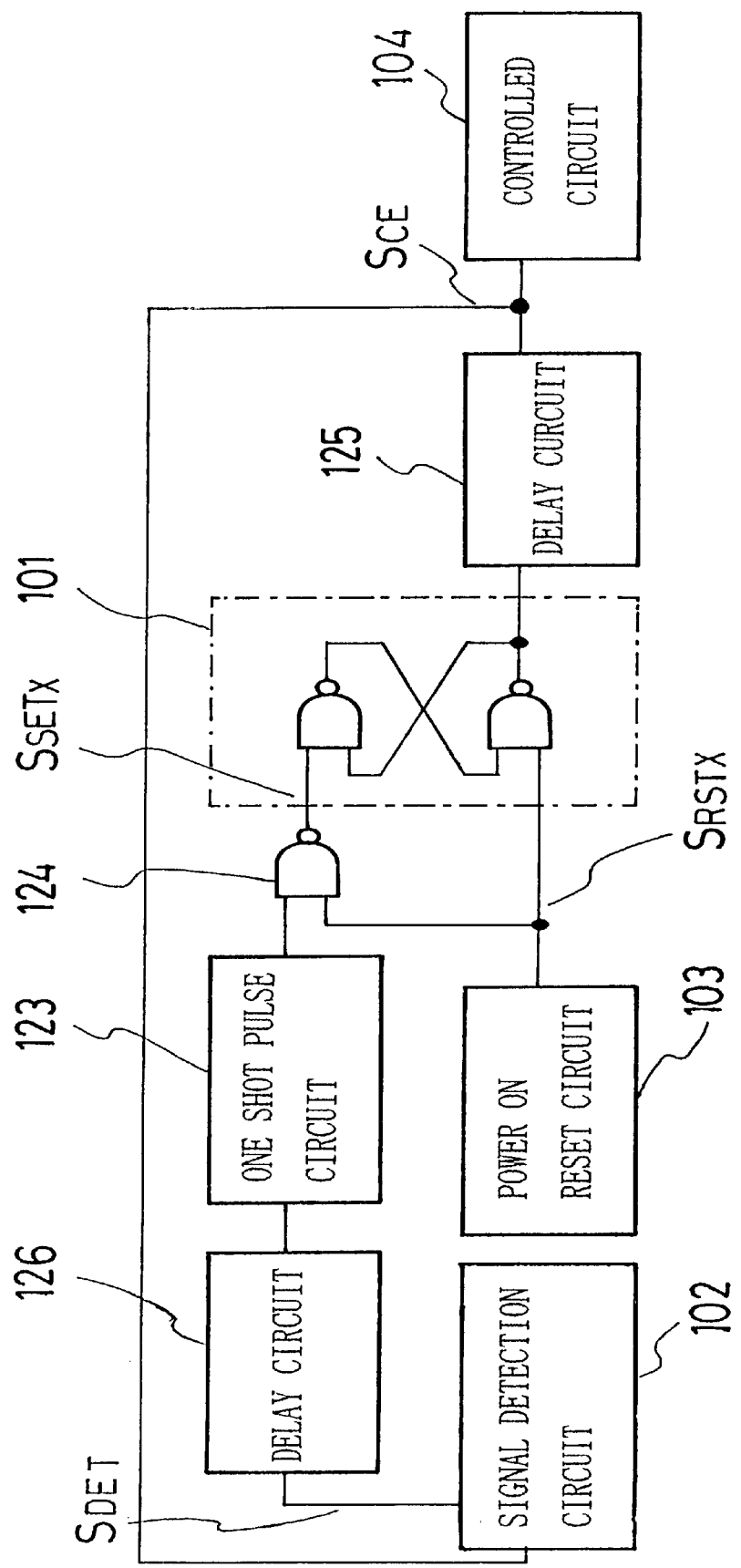
FIG. 6 is a block diagram for showing a circuit arrangement of a latch circuit according to Embodiment 6 of the present invention.

FIG. 6 is a schematic block diagram for indicating a circuit arrangement of a latch circuit according to Embodiment 6 of the present invention.

The circuit arrangement of this sixth latch circuit is made by further adding a delay circuit 126 to the latch circuit of Embodiment 5.

This delay circuit 126 owns the following effect. That is, for instance, in the case that the signal detecting circuit detects that the power supply voltage is low, this signal detecting circuit produces the detection signal when the power supply is turned ON. As a consequence, this delay circuit 126 has such a masking function capable of masking the detection signal "$S_{DET}$" of the signal detecting circuit for a time duration during which the power supply voltage is increased up to the normal voltage value in the case that the power supply is turned ON under normal condition. Therefore, this delay circuit 126 can avoid such an operation that the system stops its operation, although this system can be operated under normal condition when the power supply is turned ON. Also, even when the signal detecting circuit corresponds to a circuit other than the power supply voltage detecting circuit, this delay circuit 126 owns another effect capable of avoiding the following difficulty. That is, this signal detecting circuit is latched under unstable output condition at the initial stage when the power supply is turned ON, so that the system stops its operation.

With employment of such a circuit arrangement, the latch circuit of this embodiment 6 can firmly stop the system in the safety manner when an abnormal condition happens to occur, and also can surely restart the operation by again turning ON the power supply.

Embodiment 7

Figure 7:
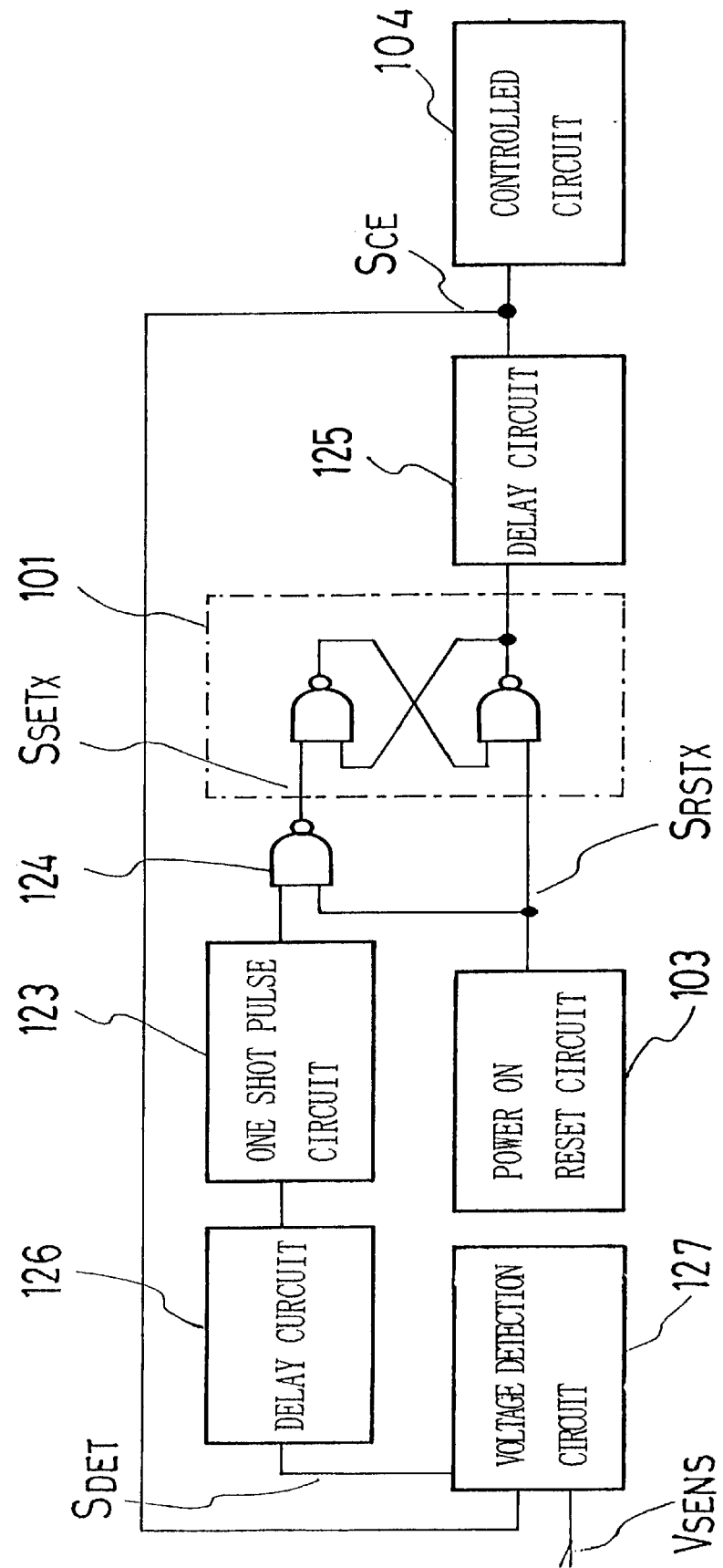
FIG. 7 is a block diagram for indicating a circuit arrangement of a latch circuit according to Embodiment 7 of the present invention.

FIG. 7 is a schematic block diagram for indicating a circuit arrangement of a latch circuit according to Embodiment 7 of the present invention.

This seventh latch circuit is featured by that the signal detecting circuit of Embodiment 6 is replaced by a voltage detecting circuit 127.

There are many cases that this voltage detecting circuit 127 may detect a power supply voltage, a voltage at a specific terminal, or a voltage at a node. Also, there is another case that operation of the system is stopped by this voltage detecting circuit 127, while the voltage detecting circuit 127 may detect a voltage higher than a preselected detection voltage, another voltage lower than this preselected detection voltage, or may detect the above-described two voltages.

With employment of such a circuit arrangement, the latch circuit of this embodiment 7 can firmly stop the system in the safety manner when an abnormal condition happens to occur, and also can surely restart the operation by again turning ON the power supply.

Embodiment 8

Figure 8:
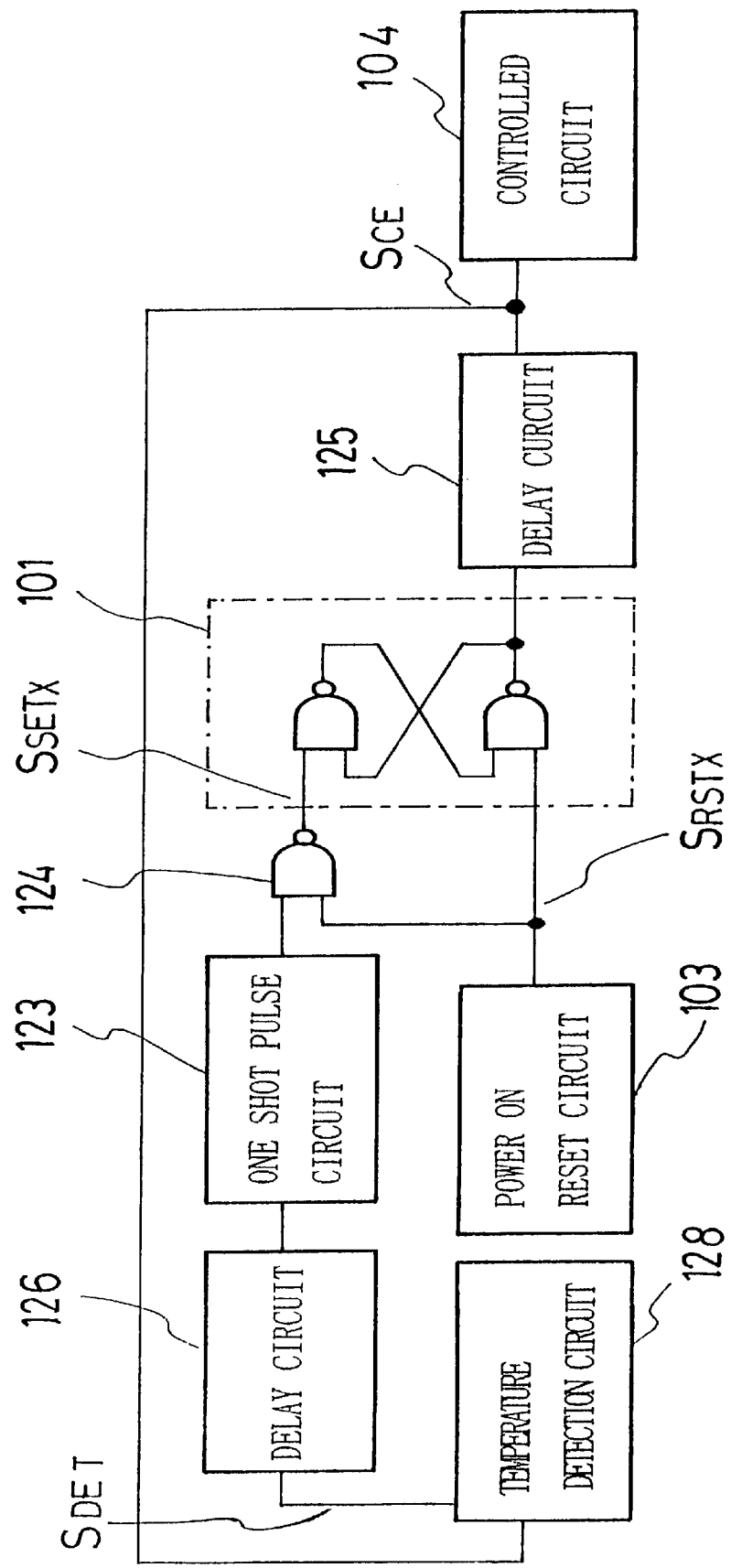
FIG. 8 is a block diagram for showing a circuit arrangement of a latch circuit according to Embodiment 8 of the present invention.

FIG. 8 is a schematic block diagram for indicating a circuit arrangement of a latch circuit according to Embodiment 8 of the present invention.

This eighth latch circuit is featured by that the signal detecting circuit of Embodiment 6 is replaced by a temperature detecting circuit 128.

As a temperature to be detected, this temperature detecting circuit 128 may detect an ambient temperature, or may detect a junction temperature of a semiconductor integrated circuit itself on which this eighth latch circuit is mounted. Also, there is another case that operation of a system is stopped by this temperature detecting circuit 128, while the temperature detecting circuit 128 may detect a temperature higher than a preselected detection temperature, another temperature lower than this preselected detection temperature, or may detect the above-described two temperatures.

With employment of such a circuit arrangement, the latch circuit of this embodiment 8 can firmly stop the system in the safety manner when an abnormal condition happens to occur, and also can surely restart the operation by again turning ON the power supply.

Embodiment 9

Figure 9:
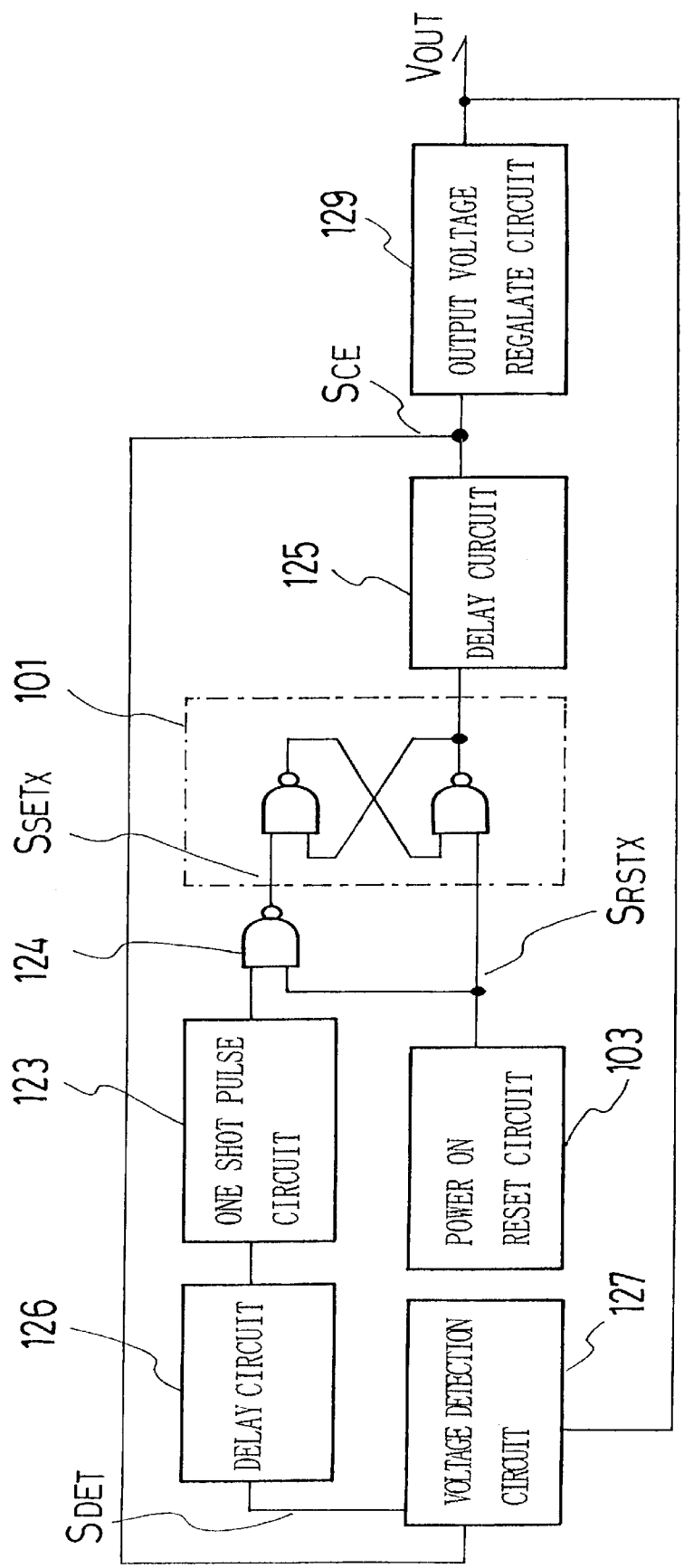
FIG. 9 is a block diagram for indicating a circuit arrangement of a latch circuit according to Embodiment 9 of the present invention.

FIG. 9 is a schematic block diagram for indicating a circuit arrangement of a latch circuit according to Embodiment 9 of the present invention.

This ninth latch circuit is featured by that the circuit to be controlled according to Embodiment 7 is replaced by an output voltage regulating circuit 129.

While an output signal "$V_{OUT}$" of the output voltage regulating circuit 129 is monitored by the voltage detecting circuit 127, this ninth latch circuit is arranged by that when the voltage detecting circuit 127 detects such a fact that the output signal $V_{OUT}$ of the output voltage regulating circuit 129 is for example short-circuited, the operation is stopped.

With employment of such a circuit arrangement, the latch circuit of this embodiment 9 can firmly stop the system in the safety manner when an abnormal condition happens to occur, and also can surely restart the operation by again turning ON the power supply.

As previously described in detail, in accordance with the latch circuit of the present invention, this latch circuit can firmly reset the operation-stopped system to the initial condition by merely again turning ON the power supply. In addition, the operation-stopped system is not unnecessarily reset until the power supply is interrupted. As a consequence, it is possible to obtain the safety operation as well as the firm operation of the circuit and the system.

What is claimed is:

1. A latch circuit comprising: detecting means for detecting a measured property and outputting a detection signal; holding means for holding a given signal detection condition when the detection signal indicates that the measured property has a given value; and releasing means for releasing the given signal detection condition; wherein the holding means continuously holds the given signal detection condition until a power supply is interrupted, even when the detection signal no longer indicates that the measured property has the given value, the releasing means produces a release signal only when the power supply is turned ON, and once the holding means has begun holding the given signal detection condition, the holding means is reset to another condition only when the power supply is interrupted and then is again turned ON; wherein the releasing means comprises power supply voltage detecting means for detecting a power supply voltage of the power supply, release signal time determining means for determining a time duration of the release signal, and means for shaping a waveform of the release signal; and wherein the releasing means is driven as a power-ON reset circuit by continuously outputting the release signal after the power supply is turned ON until a preselected time period has passed or until the power supply voltage has reached a constant voltage level.

2. A latch circuit according to claim 1; wherein the power supply voltage detecting means comprises a depletion-mode N-channel MIS transistor and an enhancement-mode P-channel MIS transistor; wherein a gate and a source of the depletion-mode N-channel MIS transistor are connected to ground potential, a drain of the depletion-mode N-channel MIS transistor is commonly connected to a drain of the enhancement-mode P-channel MIS transistor, which serves as an output terminal of the power supply voltage detecting means, a source of the enhancement-mode P-type MIS transistor is connected to the power supply potential, and a gate of the enhancement-mode P-type MIS transistor is feedback-connected to the output of the power-ON reset circuit; and wherein the latch circuit turns ON the enhancement-mode P-channel MIS transistor only while the power-ON reset circuit produces the release signal for releasing the given signal detection condition.

3. A latch circuit according to claim 2; wherein the holding means has an enhancement-mode N-type MIS transistor and an enhancement-mode P-type MIS transistor, each having a first threshold voltage; and a second threshold voltage of the P-channel MIS transistor of the power supply voltage detecting means is higher than an absolute value of the first threshold voltage of the P-channel MIS transistor and the N-channel MIS transistor of the holding means.

4. A latch circuit according to claim 1; wherein the release signal time determining means comprises a first capacitor having one terminal connected to the power supply potential, a depletion-mode N-channel MIS transistor having a drain connected to another terminal of the first capacitor, a first enhancement-mode N-channel MIS transistor having a drain commonly connected to a gate and a source of the depletion-mode N-channel MIS transistor, an inverter circuit having an input which corresponds to a junction point between the first capacitor and the drain of the depletion-mode N-channel MIS transistor, a second capacitor connected between an output terminal of the inverter circuit and ground potential, and a second enhancement-mode N-channel MIS transistor having a gate connected to the output terminal of the inverter circuit, a drain connected to the input of the inverter circuit, and a source connected to the ground potential; wherein the gate of the first enhancement-mode N-channel MIS transistor is connected to the output terminal of the power supply voltage detecting means; and wherein an output of the inverter circuit constitutes the output of the release signal time determining means.

5. A latch circuit according to claim 4; wherein the holding means has an enhancement-mode N-type MIS transistor and an enhancement-mode P-type MIS transistor, each having a first threshold voltage; the inverter circuit of the release signal time determining means comprises an enhancement-mode P-channel MIS transistor having a second threshold voltage and an enhancement-mode N-channel MIS transistor; wherein an absolute value of the second threshold voltage of the enhancement-mode P-channel MIS transistor is higher than an absolute value of the first threshold voltage of the P-channel MIS transistor and the N-channel MIS transistor of the holding means.

6. A latch circuit according to claim 4; wherein the holding means has an enhancement-mode N-type MIS transistor and an enhancement-mode P-type MIS transistor, each having a first threshold voltage; the inverter circuit of the release signal time determining means comprises an enhancement-mode P-channel MIS transistor and an enhancement-mode N-channel MIS transistor having a second threshold voltage; and an absolute value of the second threshold voltage of the enhancement-mode N-channel MIS transistor is lower than an absolute value of the first threshold voltage of the P-channel MIS transistor and the N-channel MIS transistor of the holding means.

7. A latch circuit for controlling the operational state of a controlled circuit based upon a measured value, comprising: a detecting circuit for detecting the measured value and outputting a corresponding detection signal; a holding circuit for receiving the detection signal and holding the controlled circuit in a given state when the detection signal indicates that the measured value has a given value, and maintaining the controlled circuit in the given state until a power supply is interrupted, even when the detection signal no longer indicates that the measured property has the given value; and a releasing circuit for outputting a release signal to release the controlled circuit from the given state and place it into another state only when the power supply has been interrupted and then is again turned ON, the releasing circuit comprising a power supply voltage detecting circuit for detecting a power supply voltage of the power supply, a release signal time determining circuit for determining a time duration of the release signal, and a waveform shaping circuit for shaping a waveform of the release signal, and the releasing circuit being driven as a power-ON reset circuit by continuously outputting a release signal after the power supply is turned ON until a preselected time period has passed or until the power supply voltage has reached a constant power supply voltage.

8. A latch circuit according to claim 7; wherein the power supply voltage detecting circuit comprises a depletion-mode N-channel MIS transistor and an enhancement-mode P-channel MIS transistor; wherein a gate and a source of the depletion-mode N-channel MIS transistor are connected to ground potential, a drain of the depletion-mode N-channel MIS transistor is commonly connected to a drain of the enhancement-mode P-channel MIS transistor, which constitutes an output terminal of the power supply voltage detecting means, a source of the enhancement-mode P-type MIS transistor is connected to the power supply potential, a gate of the enhancement-mode P-type MIS transistor is feedback-connected to the output of the power-ON reset circuit; and wherein the latch circuit turns ON the enhancement-mode P-channel MIS transistor only while the power-ON reset circuit produces the release signal for releasing the given signal detection condition.

9. A latch circuit according to claim 8; wherein the holding circuit has an enhancement-mode N-type MIS transistor and an enhancement-mode P-type MIS transistor, each having a first threshold voltage; and an absolute value of a second threshold voltage of the P-channel MIS transistor of the power supply voltage detecting means is higher than an absolute value of the first threshold voltage of the P-channel MIS transistor and the N-channel MIS transistor of the holding means.

10. A latch circuit according to claim 8; wherein the release signal time determining circuit comprises a first capacitor having one terminal connected to a power supply potential, a depletion-mode N-channel MIS transistor having a drain connected to another terminal of the first capacitor, a first enhancement-mode N-channel MIS transistor having a drain commonly connected to both a gate and a source of the depletion-mode N-channel MIS transistor, an inverter circuit having an input which corresponds to a junction point between the first capacitor and the drain of the depletion-mode N-channel MIS transistor, a second capacitor connected between an output terminal of the inverter circuit and the ground potential, and a second enhancement-mode N-channel MIS transistor having a gate connected to the output terminal of the inverter circuit, a drain connected to the input of the inverter circuit, and a source connected to the ground potential; wherein the gate of the first enhancement-mode N-channel MIS transistor is connected to the output terminal of the power supply voltage detecting circuit; and an output of the inverter circuit constitutes the output of the release signal time determining circuit.

11. A latch circuit according to claim 10; wherein the holding circuit has an enhancement-mode N-type MIS transistor and an enhancement-mode P-type MIS transistor, each having a first threshold voltage; the inverter circuit of the release signal time determining circuit comprises an enhancement-mode P-channel MIS transistor having a second threshold voltage and an enhancement-mode N-channel MIS transistor; wherein an absolute value of the second threshold voltage of the enhancement-mode P-channel MIS transistor is higher than an absolute value of the first threshold voltage of the P-channel MIS transistor and the N-channel MIS transistor of the holding circuit.

12. A latch circuit according to claim 10; wherein the holding circuit has an enhancement-mode N-type MIS transistor and an enhancement-mode P-type MIS transistor, each having a first threshold voltage; the inverter circuit of the release signal time determining means comprises an enhancement-mode P-channel MIS transistor and an enhancement-mode N-channel MIS transistor having a second threshold voltage; and an absolute value of the second threshold voltage of the enhancement-mode N-channel MIS transistor is lower than an absolute value of the first threshold voltage of the P-channel MIS transistor and the N-channel MIS transistor of the holding circuit.

* * * * *